United States Patent
Chien et al.

(10) Patent No.: US 12,292,468 B2
(45) Date of Patent: May 6, 2025

(54) INSPECTION SYSTEM AND INSPECTION METHOD OF BARE CIRCUIT BOARD

(71) Applicant: Unimicron Technology Corp., Taoyuan (TW)

(72) Inventors: Chun-Hsien Chien, Taoyuan (TW); Hsin-Hung Lee, Taoyuan (TW); Hsuan-Yu Lai, Taoyuan (TW); Yu-Chung Hsieh, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 238 days.

(21) Appl. No.: 18/315,474

(22) Filed: May 10, 2023

(65) Prior Publication Data
US 2024/0310428 A1    Sep. 19, 2024

(30) Foreign Application Priority Data
Mar. 14, 2023   (TW) .................. 112109411

(51) Int. Cl.
*G01R 31/28*    (2006.01)

(52) U.S. Cl.
CPC ..... *G01R 31/2805* (2013.01); *G01R 31/2808* (2013.01)

(58) Field of Classification Search
CPC ............ G01R 31/2805; G01R 31/2808; G01R 29/0871; G01R 29/0878; G01R 29/105; H01L 23/66; H01L 2224/16225; H01L 223/6677
See application file for complete search history.

(56) References Cited

U.S. PATENT DOCUMENTS

| | | | | |
|---|---|---|---|---|
| 11,032,012 | B2* | 6/2021 | Rowell | H04B 17/391 |
| 11,579,178 | B1* | 2/2023 | Lee | G01R 29/0871 |
| 2001/0052779 | A1* | 12/2001 | Okazaki | G01R 29/0814 |
| | | | | 324/637 |
| 2009/0153158 | A1* | 6/2009 | Dunn | G01R 31/2822 |
| | | | | 324/762.01 |
| 2019/0356397 | A1* | 11/2019 | DaSilva | H04B 17/29 |
| 2021/0011069 | A1* | 1/2021 | Chen | G01R 31/2896 |
| 2022/0308107 | A1* | 9/2022 | Hesselbarth | G01R 31/2822 |

FOREIGN PATENT DOCUMENTS

| | | |
|---|---|---|
| TW | 200928382 A | 7/2009 |
| TW | 201015092 A | 4/2010 |
| TW | I693414 B | 5/2020 |
| TW | I697681 B | 7/2020 |

* cited by examiner

*Primary Examiner* — Thang X Le
(74) *Attorney, Agent, or Firm* — CKC & Partners Co., LLC

(57) ABSTRACT

An inspection system and an inspection method of a bare circuit board are provided. The inspection system is used for inspecting a bare circuit board. The bare circuit board includes a chip pad and an antenna. The inspection system includes an adapter board, a test device and a measure device. The adapter board includes a chip and a contact structure. The chip is electrically connected to the contact structure. The contact structure touches the chip pad so that the chip is electrically connected to the chip pad. The test device includes a transceiver antenna. The test device and the bare circuit board separate. The measure device is electrically connected to the chip or the transceiver antenna.

16 Claims, 11 Drawing Sheets

INSPECTION SYSTEM AND INSPECTION METHOD OF BARE CIRCUIT BOARD

CROSS-REFERENCE TO RELATED APPLICATION

This application claims priority to Taiwan Application Serial Number 112109411, filed Mar. 14, 2023, which is herein incorporated by reference in its entirety.

BACKGROUND

Technical Field

The present disclosure relates to an inspection system and an inspection method. More particularly, the present disclosure relates to the inspection system and the inspection method which are used to inspect a bare circuit board without any active component mounted thereto.

Description of Related Art

Circuit boards in the present mobile devices (such as smartphones and tablet computers) almost have antennas, so that the mobile devices can have functions of wireless communications. These circuit boards with antennas which are complete are inspected to make sure whether the antennas work normally.

SUMMARY

At least one embodiment of the disclosure provides an inspection system which is applicable to inspect a bare circuit board having an antenna.

The inspection system according to at least one embodiment of the disclosure is used for inspecting the bare circuit board which includes a chip pad and the antenna, in which the chip pad is electrically connected to the antenna. The inspection system includes an adapter board, a test device and a measuring device. The adapter board includes a chip and a contact structure, in which the chip is electrically connected to the contact structure, and the contact structure touches the chip pad so that the chip is electrically connected to the chip pad. The test device includes a transceiver antenna, in which the test device and the bare circuit board are separate. The measuring device is electrically connected to one of the chip and the transceiver antenna. When the chip generates a chip test signal, the chip test signal is transmitted to the bare circuit board via the contact structure and radiated from the antenna. The transceiver antenna outputs an electrical test signal to the measuring device after receiving the chip test signal. The measuring device measures a property parameter of the antenna according to the electrical test signal. When the transceiver antenna radiates an antenna test signal, the bare circuit board receives the antenna test signal by the antenna and the antenna outputs and transmits an electrical signal to the chip via the contact structure. The chip outputs a demodulated test signal to the measuring device after receiving the electrical signal. The measuring device measures the property parameter of the antenna according to the demodulated test signal.

At least one embodiment of the disclosure provides an inspection method which is applicable to inspect a bare circuit board having an antenna.

The inspection method according to at least one embodiment of the disclosure includes: using a contact structure of an adapter board to touch a chip pad of a bare circuit board so that a chip of the adapter board is electrically connected to an antenna of the bare circuit board via the chip pad; making the chip generate a chip test signal; transmitting the chip test signal to the bare circuit board via the contact structure and radiating the chip test signal from the antenna of the bare circuit board; outputting an electrical test signal from a transceiver antenna after receiving the chip test signal from the antenna; and measuring a property parameter of the antenna according to the electrical test signal.

The inspection method according to at least one embodiment of the disclosure includes: using a contact structure of an adapter board to touch a chip pad of a bare circuit board so that a chip of the adapter board is electrically connected to an antenna of the bare circuit board via the chip pad; making a transceiver antenna radiate an antenna test signal; making the antenna of the bare circuit board receive the antenna test signal and output an electrical signal; transmitting the electrical signal to the chip via the contact structure; making the chip output a demodulated signal after the chip receives the electrical signal; and measuring a property parameter of the antenna according to the demodulated signal.

Based on the above, the inspection system and the inspection method according to the above embodiments can inspect whether the antenna of the bare circuit board works normally by using the adapter board electrically connected to the bare circuit board to drive the antenna, thereby confirming the quality of the bare circuit board.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
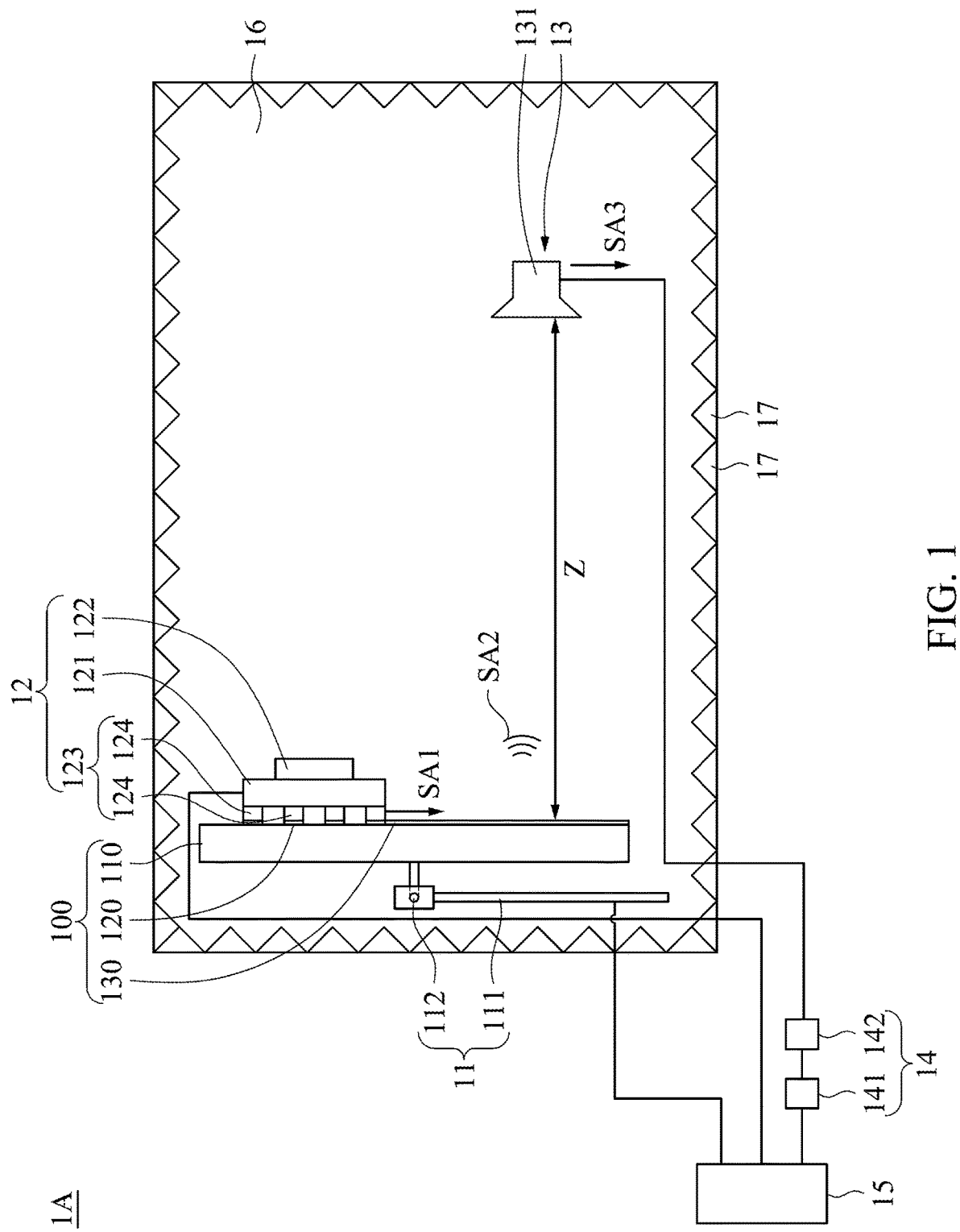
FIG. 1 is a schematic diagram of an inspection system according to at least one embodiment of this disclosure.

Reference will now be made in detail to the present embodiments of the disclosure, examples of which are illustrated in the accompanying drawings. Wherever possible, the same reference numbers are used in the drawings and the description to refer to the same or like parts.

In the following description, in order to clearly present the technical features of the present disclosure, the dimensions (such as length, width, thickness, and depth) of elements (such as layers, films, substrates, and areas) in the drawings will be enlarged in unusual proportions, and the quantity of some elements will be reduced. Accordingly, the description and explanation of the following embodiments are not limited to the quantity, sizes and shapes of the elements presented in the drawings, but should cover the sizes, shapes, and deviations of the two due to actual manufacturing processes and/or tolerances.

For example, the flat surface shown in the drawings may have rough and/or non-linear characteristics, and the acute angle shown in the drawings may be round. Therefore, the elements presented in the drawings in this case which are mainly for illustration are intended neither to accurately depict the actual shape of the elements nor to limit the scope of patent applications in this case.

Moreover, the words, such as "about", "approximately", or "substantially", appearing in the present disclosure not only cover the clearly stated values and ranges, but also include permissible deviation ranges as understood by those with ordinary knowledge in the technical field of the invention. The permissible deviation range can be caused by the error generated during the measurement, where the error is caused by such as the limitation of the measurement system or the process conditions. In addition, "about" may be expressed within one or more standard deviations of the values, such as within +30%, +20%, +10%, or +5%. The word "about", "approximately" or "substantially" appearing in this text can choose an acceptable deviation range or a standard deviation according to optical properties, etching properties, mechanical properties or other properties, not just one standard deviation to apply all the optical properties, etching properties, mechanical properties and other properties.

Figure 2:
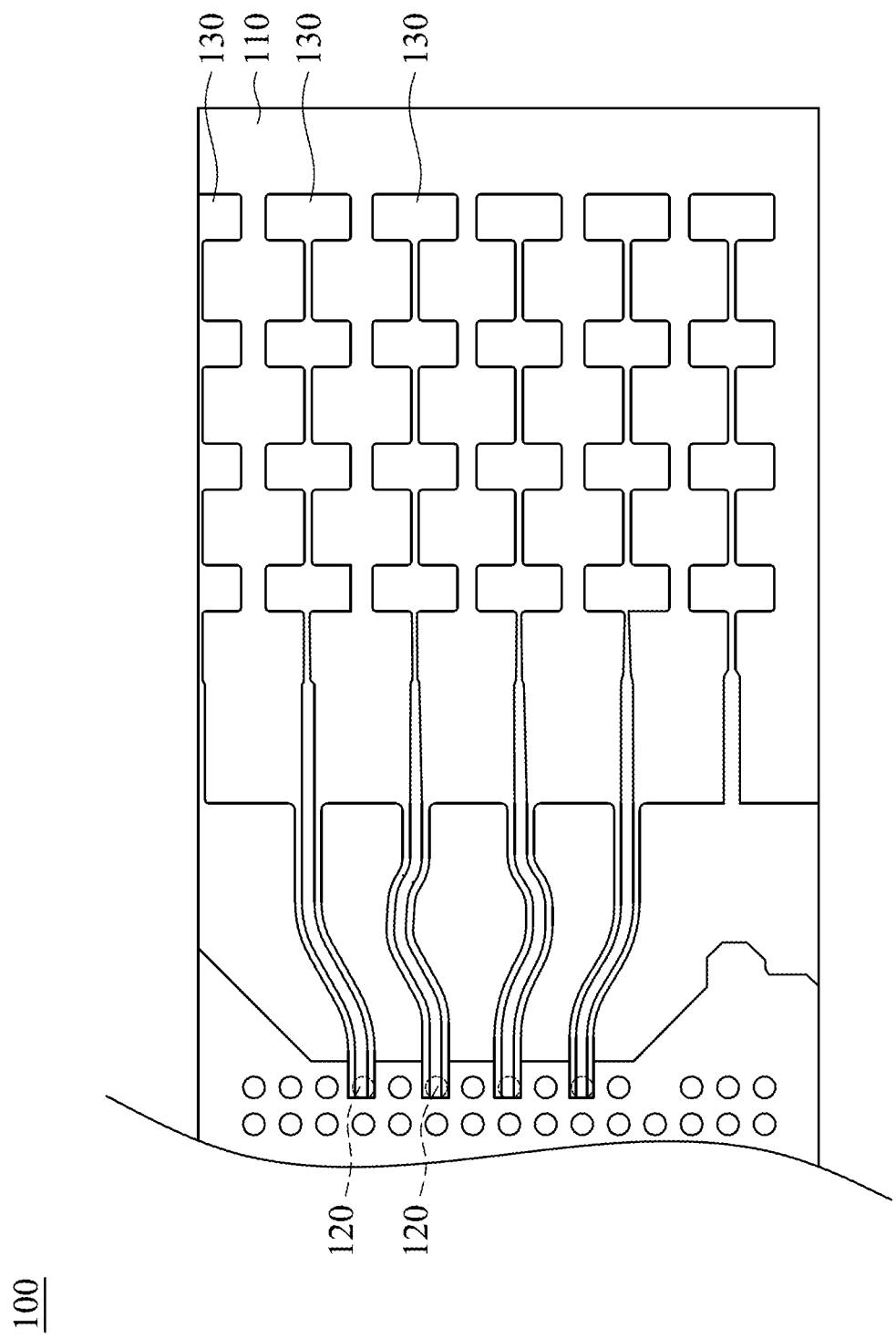
FIG. 2 is a partial enlarged schematic top view of a bare circuit board inspected by the inspection system of FIG. 1.

FIG. 1 is a schematic diagram of an inspection system 1A according to at least one embodiment of this disclosure, and FIG. 2 is a partial enlarged schematic top view of a bare circuit board 100 inspected by the inspection system 1A of FIG. 1. Referring to FIGS. 1 and 2, the inspection system 1A is configured to inspect the bare circuit board 100. The inspection system 1A includes a positioner 11, an adapter board 12, a test device 13, a measuring device 14 and a control device 15.

The bare circuit board 100 includes a substrate 110, at least one chip pad 120 and at least one antenna 130. In this example, the bare circuit board 100 includes multiple chip pads 120 and multiple antennas 130, but the embodiments of this disclosure are not limited thereto. In another embodiment, the quantity of the chip pad 120 included by the bare circuit board 100 may be only one. In another embodiment, the quantity of the antenna 130 included by the bare circuit board 100 may be only one. The chip pads 120 and the antennas 130 are formed on the substrate 110. The chip pads 120 provide a radio frequency chip (not shown) which controls the antennas 130 to transmit and receive the signals for mounting such as welding. In addition, the radio frequency chip is referred as a RF chip as following.

It should be added that the bare circuit board 100 is a wire substrate without any active component mounted. In other words, before the bare circuit board 100 is mounted with any active component, the electric signal that the wire substrate transmits will pass through no active component. In addition, the active component is a transistor or an integrated circuit (IC) with at least one transistor, and the active component also may be a packaged chip or an unpackaged die (also called bare die).

The positioner 11 is configured to install the bare circuit board 100, in which the positioner 11 includes a first rotation axis 111 and a second rotation axis 112. When the bare circuit board 100 is inspected, the bare circuit board 100 will rotate around the first rotation axis 111 or the second rotation axis 112 according to requirements for inspections. The first rotation axis 111 and the second rotation axis 112 are perpendicular to each other.

The adapter board 12 includes a substrate 121, a chip 122 and a contact structure 123. The chip 122 is mounted on the substrate 121 and is the RF chip used for controlling the transmitting and the receiving of the antennas 130. The contact structure 123 is also mounted on the substrate 121 and is electrically connected to the chip 122. In this example, the contact structure 123 includes multiple copper pillars 124, in which the copper pillars 124 extends outward from one side of the substrate 121.

The test device 13 includes a transceiver antenna 131. The transceiver antenna 131 may be a horn antenna. The test device 13 and the bare circuit board 100 separate. In this example, the transceiver antenna 131 aligns with and directs to the antennas 130 of the bare circuit board 100. There is a direct test distance Z between the transceiver antenna 131 and the antennas 130, in which the direct test distance Z is relevant to an operating frequency of the bare circuit board 100.

The measuring device 14 may include a vector signal analyzer 141. The vector signal analyzer 141 is electrically connected to the transceiver antenna 131. The measuring device 14 may further include a frequency converter 142, in which the frequency converter 142 is electrically connected between the transceiver antenna 131 and the vector signal analyzer 141, and converts the frequency of the signal received by the vector signal analyzer 141 according to the frequency of the transmission of the bare circuit board 100 and an operating frequency of the vector signal analyzer 141, so that the vector signal analyzer 141 can perform signal processing after receiving the signal. The frequency converter 142 may perform a frequency up conversion or a frequency down conversion of the signal.

The control device 15 is electrically connected to the positioner 11, the chip 122 of the adapter board 12 and the measuring device 14. The control device 15 may be a computer, such as a desktop computer, an industrial computer or a laptop. Alternatively, the control device 15 also may be a microprocessor. The control device 15 is configured to control the rotation of the first rotation axis 111 and the second rotation axis 112 of the positioner 11. In addition, the control device 15 is configured to drive the action of the chip 122 and determine the situation of the bare circuit board 100 according to the signals received from the measuring device 14.

It is worth mentioning that the positioner 11, the adapter board 12 and the test device 13 may be placed in an anechoic chamber 16, in which the anechoic chamber 16 is the space surrounded by radio-wave absorbing material. When the bare circuit board 100 is inspected in the anechoic chamber 16, the bare circuit board 100 is simulated to be inspected in free space without any things, thereby inspecting the properties of the antennas 130 precisely.

Figure 3:
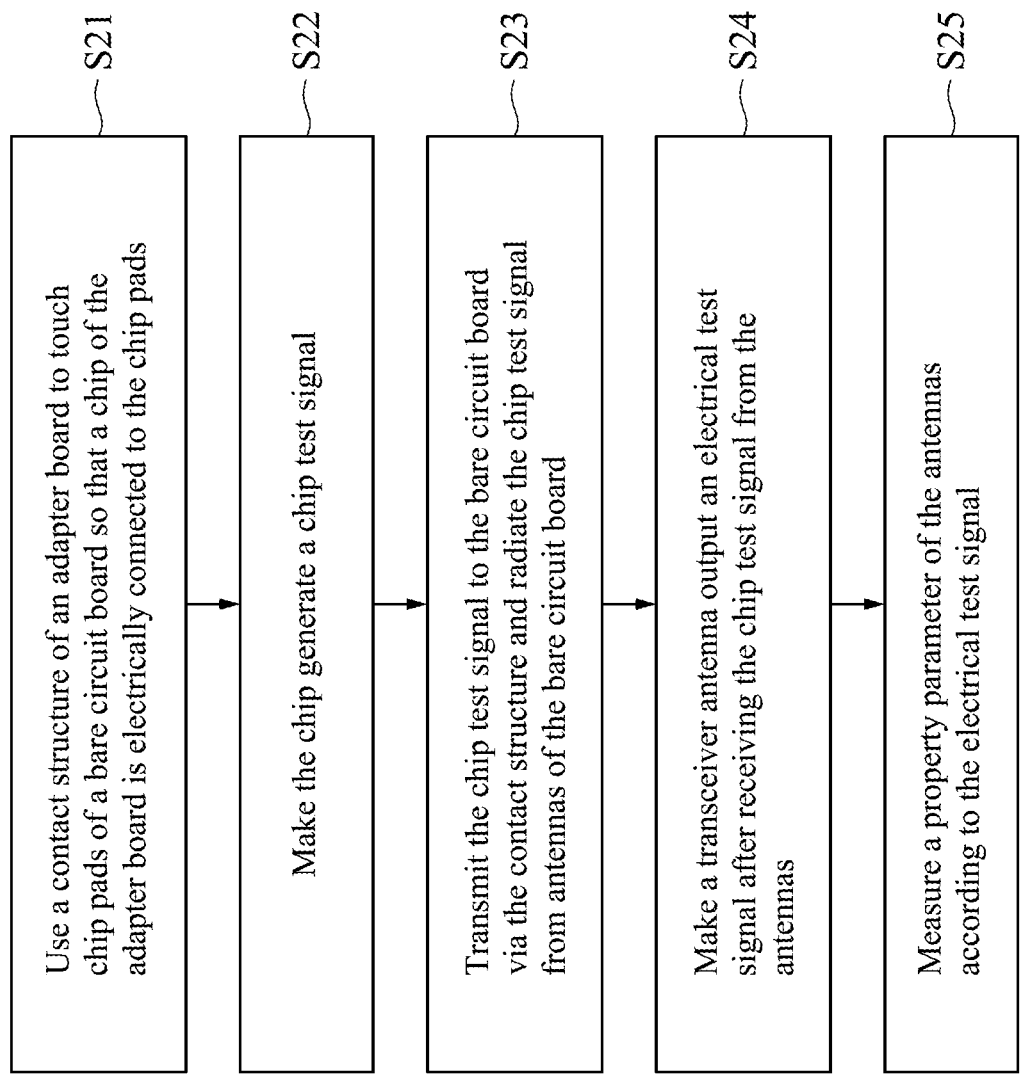
FIG. 3 is a flow chart of an inspection method according to at least one embodiment of this disclosure.

FIG. 3 is a flow chart of an inspection method 2 according to at least one embodiment of this disclosure. The following description of the inspection method 2 is applied to the inspection system 1A of FIG. 1 for example, but those skilled in the art also apply the inspection method 2 to other similar inspection systems to inspect the properties of the antennas 130 of the bare circuit board 100. Referring to FIGS. 1 to 3, at first, in step S21, use the contact structure 123 of the adapter board 12 to touch the chip pads 120 of the bare circuit board 100 so that the chip 122 of the adapter board 12 is electrically connected to the chip pads 120. Specifically, the adapter board 12 touches the chip pads 120 via the copper pillars 124 in inspecting so that the chip 122 is electrically connected to the chip pads 120.

After the inspecting completely, the adapter board 12 and the bare circuit board 100 may separate by the copper pillars 124 without touching the chip pads 120, and the bare circuit board 100 is not damaged. Because the copper pillars 124 are not fixed or connected to the chip pads 120, the copper pillars 124 can be separated from the chip pads 120. In addition, a fixture or a clamp (not shown) is used so that the copper pillars 124 of the adapter board 12 tightly touch the chip pads 120, thereby obtaining precise measuring results. For example, the clamp is used for clamping the adapter board 12 and the bare circuit board 100.

Then, in step S22, make the chip 122 generate a chip test signal SA1. Specifically, the chip 122 generates the chip test signal SA1 after receiving instructions from the control device 15, in which the chip test signal SA1 generated from the chip 122 is an electrical signal.

In step S23, the chip test signal SA1 is transmitted to the chip pads 120 of the bare circuit board 100 via the contact structure 123 and thus is transmitted to the antennas 130 of the bare circuit board 100 to radiate, in which the chip test signal SA2 radiated from the antennas 130 is a wireless signal. In step S24, the transceiver antenna 131 outputs an electrical test signal SA3 after receiving the chip test signal SA2 from the antennas 130.

Then, in step S25, the measuring device 14 measures at least one property parameter of the antennas 130 according to the electrical test signal SA3. The control device 15 obtains the capability of the antennas 130 according to the measured at least one property parameter, thereby picking the qualified bare circuit boards 100. Specifically, the frequency converter 142 may convert the frequency of the electrical test signal SA3 to the operating frequency suitable for the vector signal analyzer 141. The vector signal analyzer 141 may measure the at least one property parameter such as at least one of an error vector magnitude (EVM), a total isotropic sensitivity (TIS) and a radiated power. The capability of the antennas 130 is inspected from the aforementioned inspection method.

Figure 4:
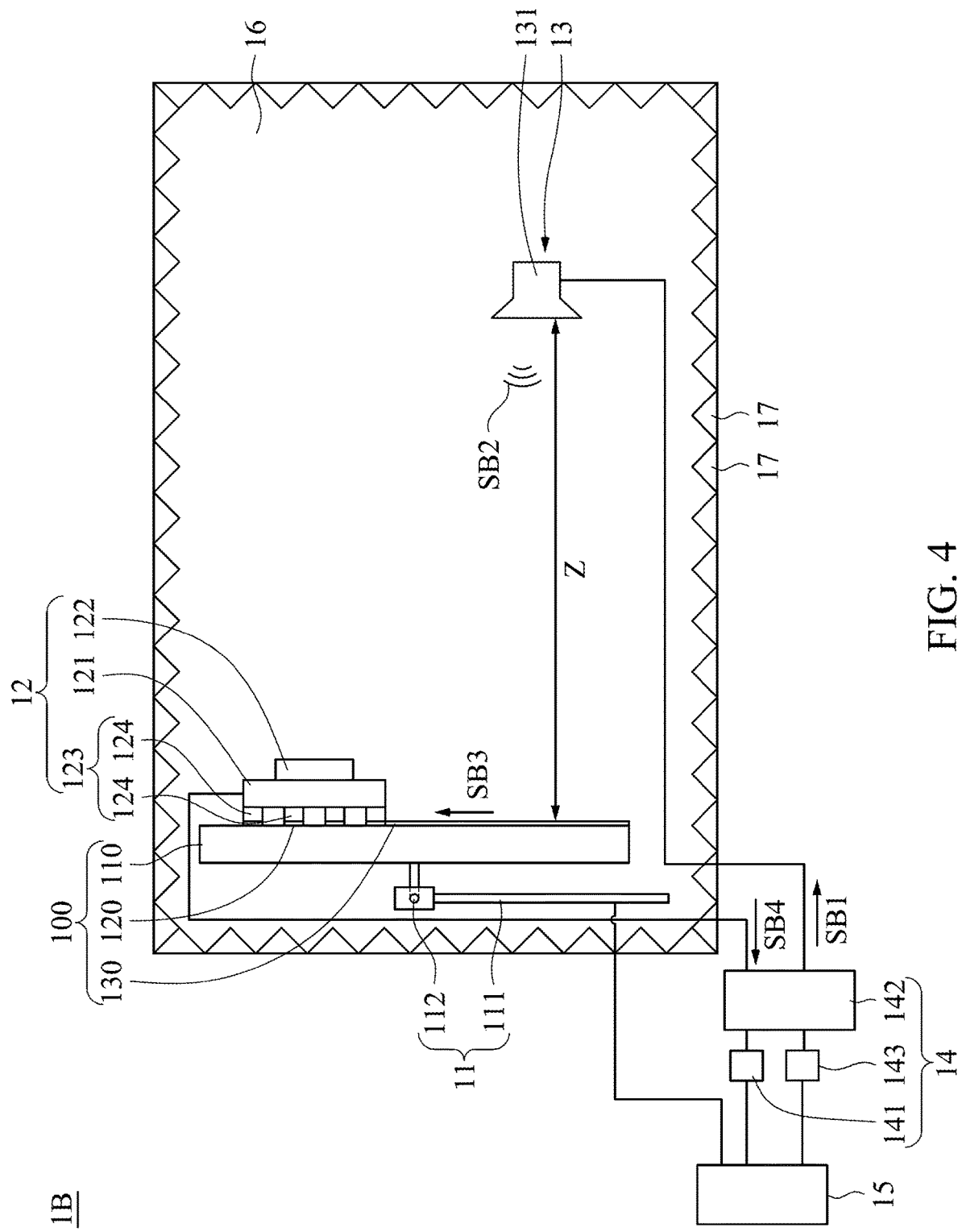
FIG. 4 is a schematic diagram of an inspection system according to another embodiment of this disclosure.

FIG. 4 is a schematic diagram of an inspection system 1B according to another embodiment of this disclosure. The inspection system 1B in FIG. 4 is similar to the inspection system 1A in FIG. 1, in which the components with the similar and the same features in the inspection system 1A and the inspection system 1B are denoted by the same reference characters. The contrast between the inspection system 1A and the inspection system 1B is that the measuring device 14 of the inspection system 1B in FIG. 4 further includes a vector signal generator 143. The vector signal analyzer 141 is electrically connected to the chip 122 of the adapter board 12. The vector signal generator 143 is electrically connected to the transceiver antenna 131. The frequency converter 142 is electrically connected between the vector signal analyzer 141 and the chip 122, and between the vector signal generator 143 and the transceiver antenna 131. The frequency converter 142 may convert the frequencies of the signal outputted from the vector signal generator 143 and the signal transmitted into the vector signal analyzer 141 according to the signal transmitted in the bare circuit board 100.

Figure 5:
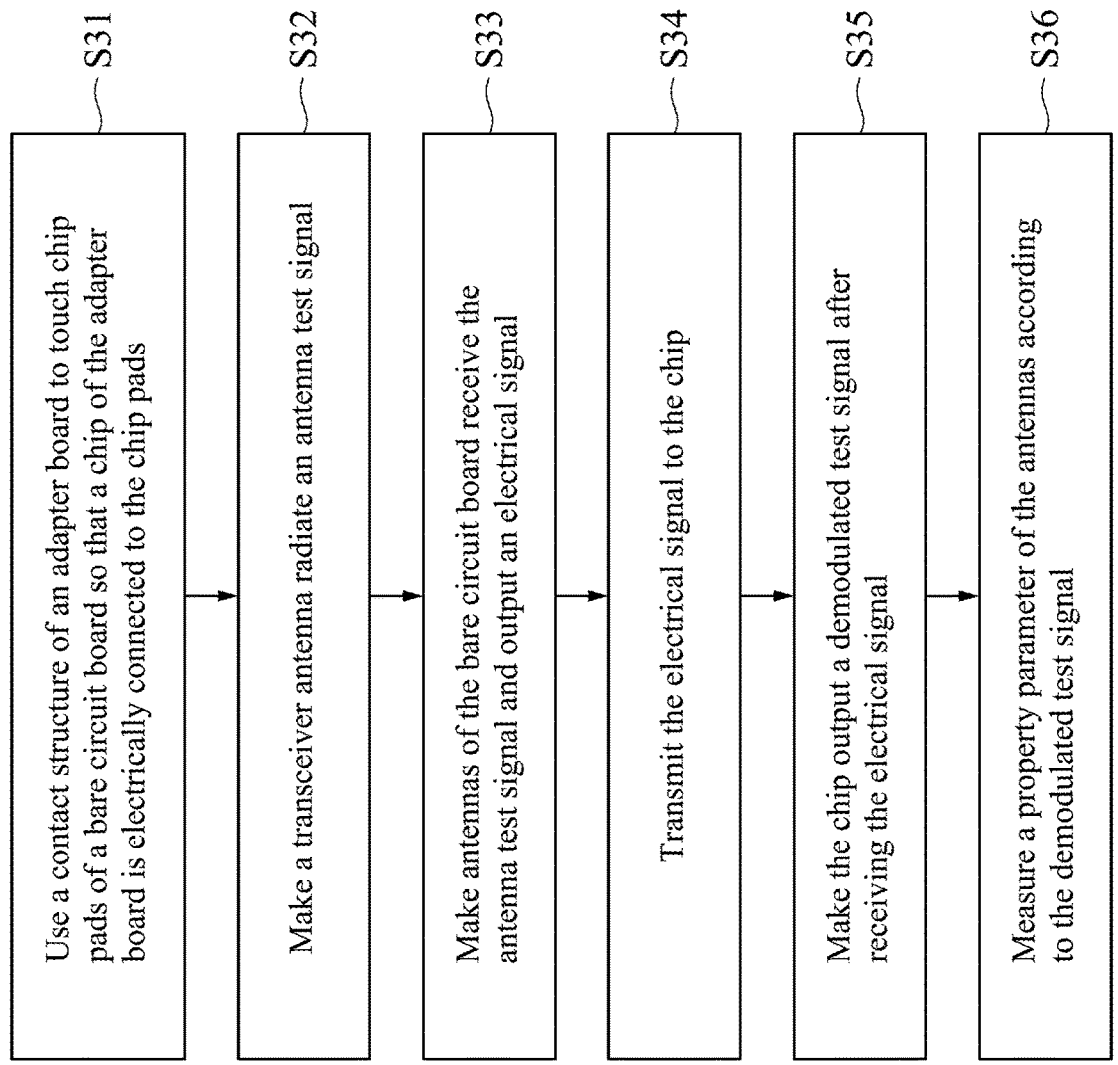
FIG. 5 is a flow chart of an inspection method according to another embodiment of this disclosure.

FIG. 5 is a flow chart of an inspection method 3 according to another embodiment of this disclosure. The following description of the inspection method 3 is applied to the inspection system 1B of FIG. 4 for example, but those skilled in the art also apply the inspection method 3 to other similar inspection systems to inspect the properties of the antennas 130 of the bare circuit board 100. Referring to FIGS. 2, 4 and 5, at first, in step S31, use the contact structure 123 of the adapter board 12 to touch the chip pads 120 of the bare circuit board 100 so that the chip 122 of the adapter board 12 is electrically connected to the chip pads 120.

In step S32, make the transceiver antenna 131 radiate an antenna test signal SB2. Specifically, the control device 15 may control the vector signal generator 143 to generate an antenna test signal SB1, in which the antenna test signal SB1 generated from the vector signal generator 143 is an electrical signal. Then, the frequency converter 142 can transmit the antenna test signal SB1 to the transceiver antenna 131 after changing the frequency of the antenna test signal SB1. The transceiver antenna 131 radiates the antenna test signal SB2 toward the antennas 130 after receiving the antenna test signal SB1, in which the antenna test signal SB2 radiated from the transceiver antenna 131 is a wireless signal.

Then, in step S33, make the antennas 130 of the bare circuit board 100 receive the antenna test signal SB2 and output an electrical signal SB3. In step S34, the electrical signal SB3 is transmitted to the chip 122 via the contact structure 123. Specifically, the electrical signal SB3 is transmitted to the chip pads 120 from the antennas 130 and thus transmitted to the chip 122 via the contact structure 123. In step S35, make the chip 122 output a demodulated test signal SB4 after receiving the electrical signal SB3. Specifically, the chip 122 outputs the demodulated test signal SB4 after demodulating the received the electrical signal SB3.

In step S36, the measuring device 14 measures the at least one property parameter of the antennas 130 according to the demodulated test signal SB4. The control device 15 obtains the capability of the antennas 130 according to the measured at least one property parameter, thereby picking the qualified bare circuit boards 100. Specifically, the demodulated test signal SB4 outputted from the chip 122 is transmitted to the frequency converter 142, and the frequency converter 142 transmits the demodulated test signal SB4 to the vector signal analyzer 141 after changing the frequency of the demodulated test signal SB4. The vector signal analyzer 141 may measure the at least one property parameter of the antennas 130 such as at least one of the error vector magnitude (EVM), the total isotropic sensitivity (TIS) and the radiated power according to the demodulated test signal SB4. The capability of the antennas 130 is inspected from the aforementioned inspection method.

It should be noted that, as shown in FIGS. 1 and 4, the frequency of the chip test signal SA2 relates to dimensions of the antennas 130 and a wavelength of the chip test signal SA2, and the frequency of the antenna test signal SB2 relates to dimensions of the antennas 130 and a wavelength of the antenna test signal SB2. Therefore, the frequencies of the chip test signal SA2 and the antenna test signal SB2 can directly affect the lengths of the direct test distances Z, respectively. For example, when the frequencies of the chip test signal SA2 and the antenna test signal SB2 are less than 3 GHZ, the direct test distances Z are greater than 10 meters or equal to 10 meters. When the frequencies of the chip test signal SA2 and the antenna test signal SB2 are in a range of 3 GHz to 30 GHz, the direct test distances Z are in a range of 5 meters to 10 meters. When the frequencies of the chip test signal SA2 and the antenna test signal SB2 are in a range of 30 GHz to 110 GHz, the direct test distances Z are in a range of 3 meters to 5 meters. When the frequencies of the chip test signal SA2 and the antenna test signal SB2 are greater than 110 GHZ, the direct test distances Z are less than 3 meters.

Figure 6:
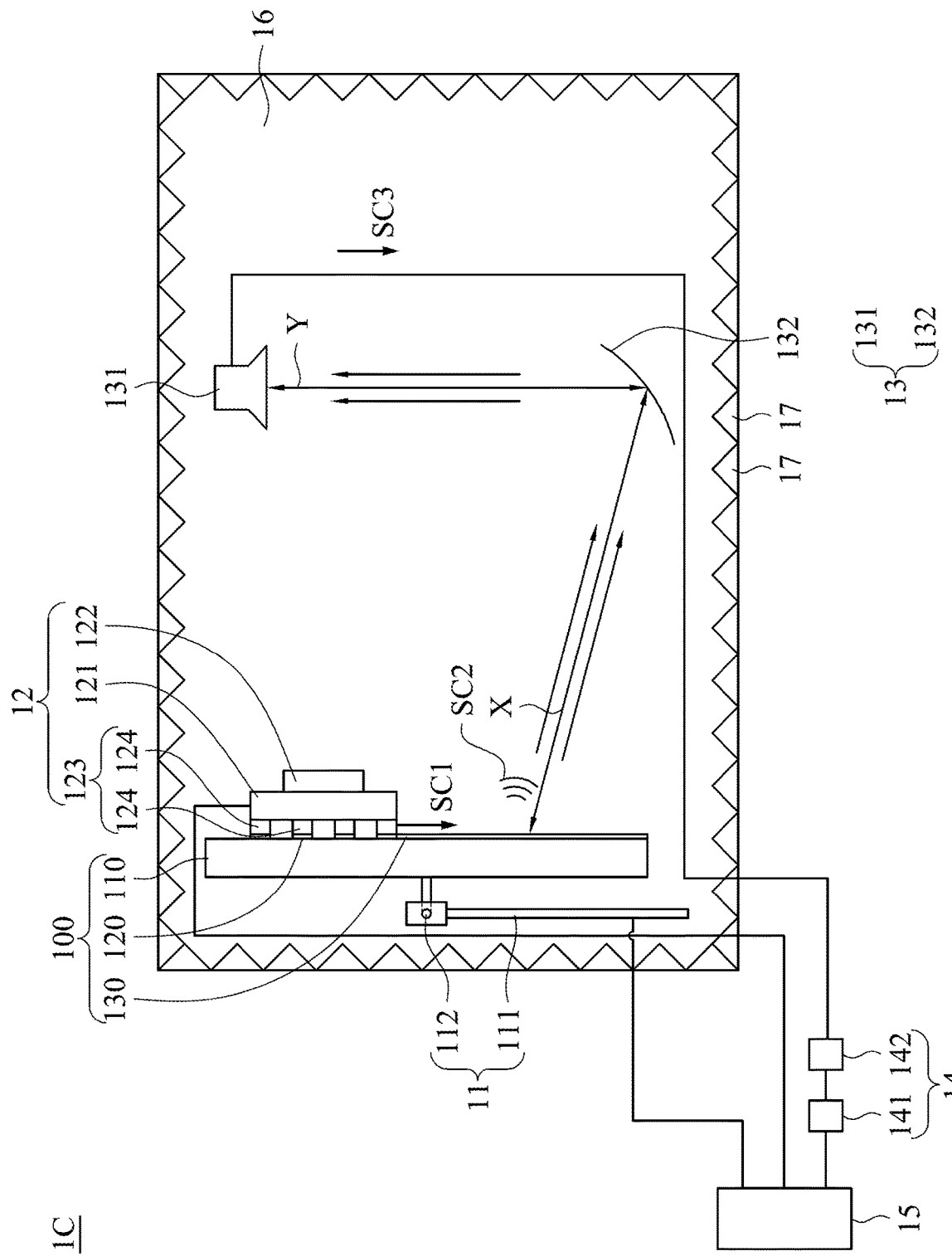
FIG. 6 is a schematic diagram of an inspection system according to another embodiment of this disclosure.

FIG. 6 is a schematic diagram of an inspection system 1C according to another embodiment of this disclosure. The inspection system 1C in FIG. 6 is similar to the inspection system 1A in FIG. 1, in which the components with the similar and the same features in the inspection system 1A and the inspection system 1C are denoted by the same reference characters. The contrast between the inspection system 1A and the inspection system 1C is that the test device 13 of the inspection system 1C in FIG. 6 further includes a reflector 132. The reflector 132 has a parabolic surface which is configured to convert the electromagnetic wave radiated from the antennas 130 from a spherical wave to a plane wave and reflect the electromagnetic wave to the transceiver antenna 131.

The antennas 130 direct to the parabolic surface and are spaced from the parabolic surface by a first distance X. The transceiver antenna 131 also directs to the parabolic surface and is spaced from the parabolic surface by a second distance Y. A sum of the first distance X and the second distance Y is substantially equal to one of the aforementioned direct test distances Z, in which the direct test distances Z relate to the operating frequencies of the bare circuit board 100, as described in the inspection systems 1A and 1B. The reflector 132 can convert the electromagnetic wave radiated from the antennas 130 from the spherical wave to the plane wave and reflect the electromagnetic wave to the transceiver antenna 131. Therefore, according to the space size of the anechoic chamber 16, the arrangement of the reflector 132 is made flexibly to adjust the first distance X and the second distance Y, thereby using the space of the anechoic chamber 16 efficiently. The inspection system 1C can more save space by the arrangement of the reflector 132 when inspecting the properties of the antennas 130 of the bare circuit board 100.

Figure 7:
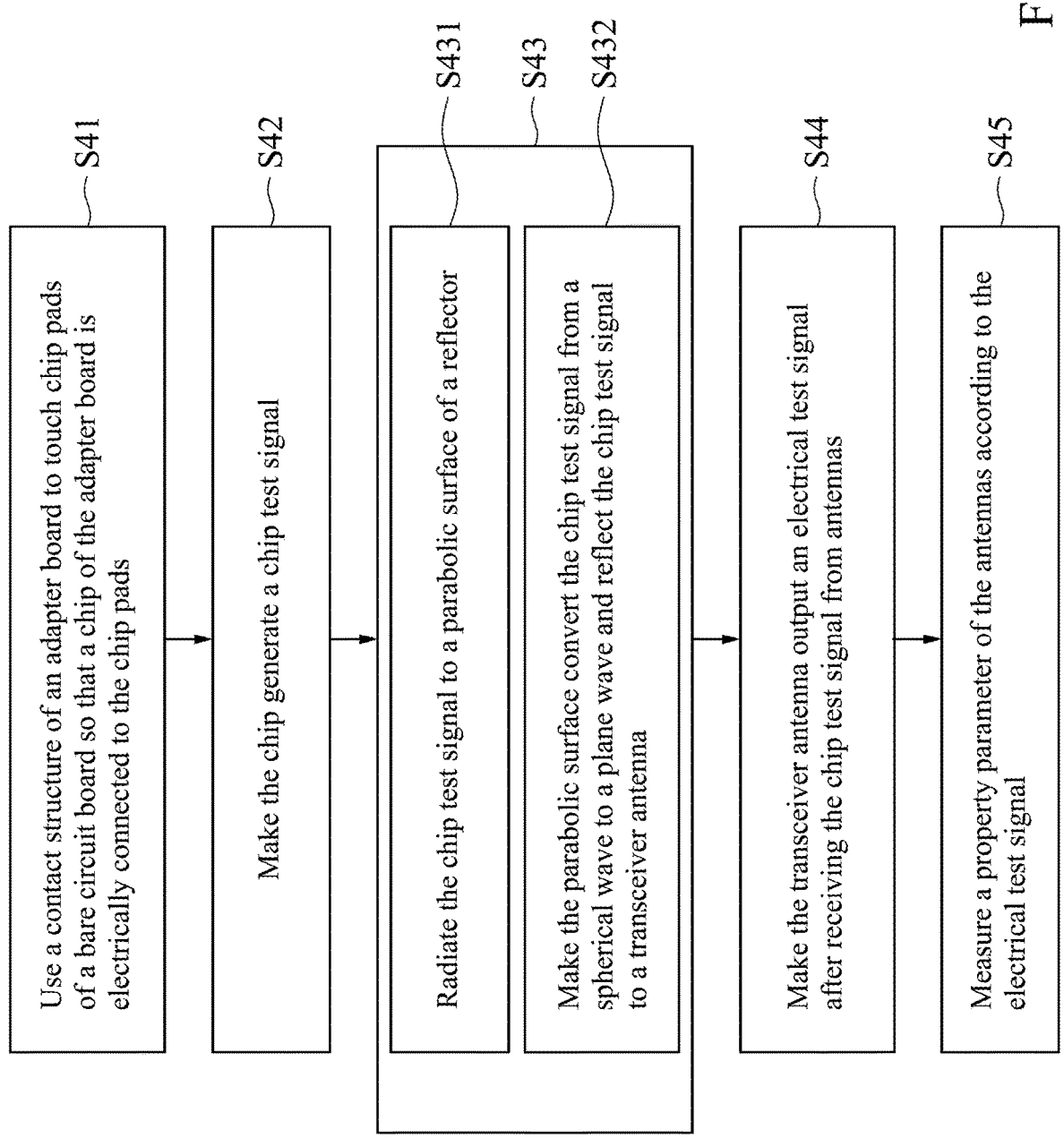
FIG. 7 is a flow chart of an inspection method according to another embodiment of this disclosure.

FIG. 7 is a flow chart of an inspection method 4 according to another embodiment of this disclosure. The following description of the inspection method 4 is applied to the inspection system 1C of FIG. 6 for example, but those skilled in the art also apply the inspection method 4 to other similar inspection systems to inspect the properties of the antennas 130 of the bare circuit board 100. Steps S41 and S42 of the inspection method 4 in FIG. 7 are similar to steps S21 and S22 of the inspection method 2 in FIG. 3, respectively, and the similar and the same features of the inspection method 2 and the inspection method 4 substantially don't repeat again for conciseness of the specification. Referring to FIGS. 6 and 7, in step S43, a chip test signal SC1 is transmitted to the bare circuit board 100 via the contact structure 123 and radiated from the antennas 130 of the bare circuit board 100.

Further, step S43 includes sub-steps S431 and S432. In sub-step S431, make antennas 130 receive the chip test signal SC1 and radiate a chip test signal SC2 to the parabolic surface of the reflector 132, in which the chip test signal SC2 radiated from the antennas 130 is a wireless signal. Then, in sub-step S432, make the parabolic surface convert the chip test signal SC2 from the spherical wave to the plane wave and reflect the chip test signal SC2 to the transceiver antenna 131. Then, in step S44, the transceiver antenna 131 outputs an electrical test signal SC3 after receiving the chip test signal SC2 from the antennas 130.

Then, in step S45, the measuring device 14 measures the at least one property parameter of the antennas 130 according to the electrical test signal SC3. The control device 15 obtains the capability of the antennas 130 according to the measured at least one property parameter, thereby picking the qualified bare circuit boards 100. The vector signal analyzer 141 of the measuring device 14 may measure the at least one property parameter such as at least one of the error vector magnitude (EVM), the total isotropic sensitivity (TIS) and the radiated power.

Figure 8:
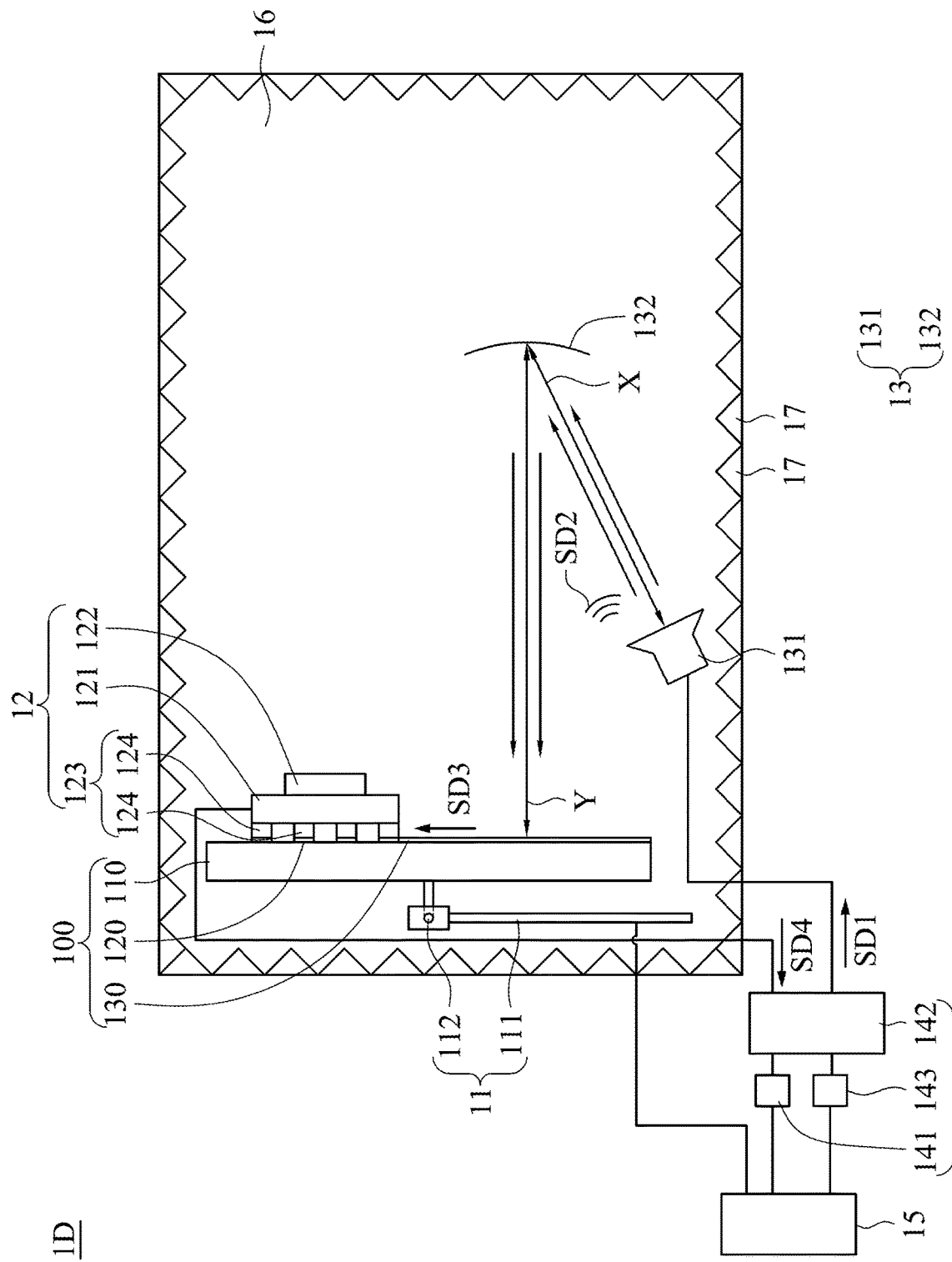
FIG. 8 is a schematic diagram of an inspection system according to another embodiment of this disclosure.

FIG. 8 is a schematic diagram of an inspection system 1D according to another embodiment of this disclosure. The inspection system 1D in FIG. 8 is similar to the inspection system 1C in FIG. 6, in which the components with the similar and the same features in the inspection system 1C and the inspection system 1D are denoted by the same reference characters. The contrast between the inspection system 1C and the inspection system 1D is that the measuring device 14 of the inspection system 1D further includes the vector signal generator 143. The vector signal analyzer 141 is electrically connected to the chip 122 via the frequency converter 142. The vector signal generator 143 is electrically connected to the transceiver antenna 131 via the frequency converter 142.

The transceiver antenna 131 directs to the parabolic surface and is spaced from the parabolic surface by the first distance X. The antennas 130 also direct to the parabolic surface and are spaced from the parabolic surface by the second distance Y. The sum of the first distance X and the second distance Y is substantially equal to one of the aforementioned direct test distances Z, in which the direct test distances Z relate to the operating frequencies of the bare circuit board 100, as described in the inspection systems 1A and 1B. The reflector 132 can convert the electromagnetic wave radiated from the transceiver antenna 131 from the spherical wave to the plane wave and reflect the electromagnetic wave to the antennas 130. The arrangement of the reflector 132 of the inspection system 1D is different from the arrangement of the reflector 132 of the inspection system 1C, thereby inspecting different properties of the antennas 130 of the bare circuit board 100 for different transfer purposes.

Figure 9:
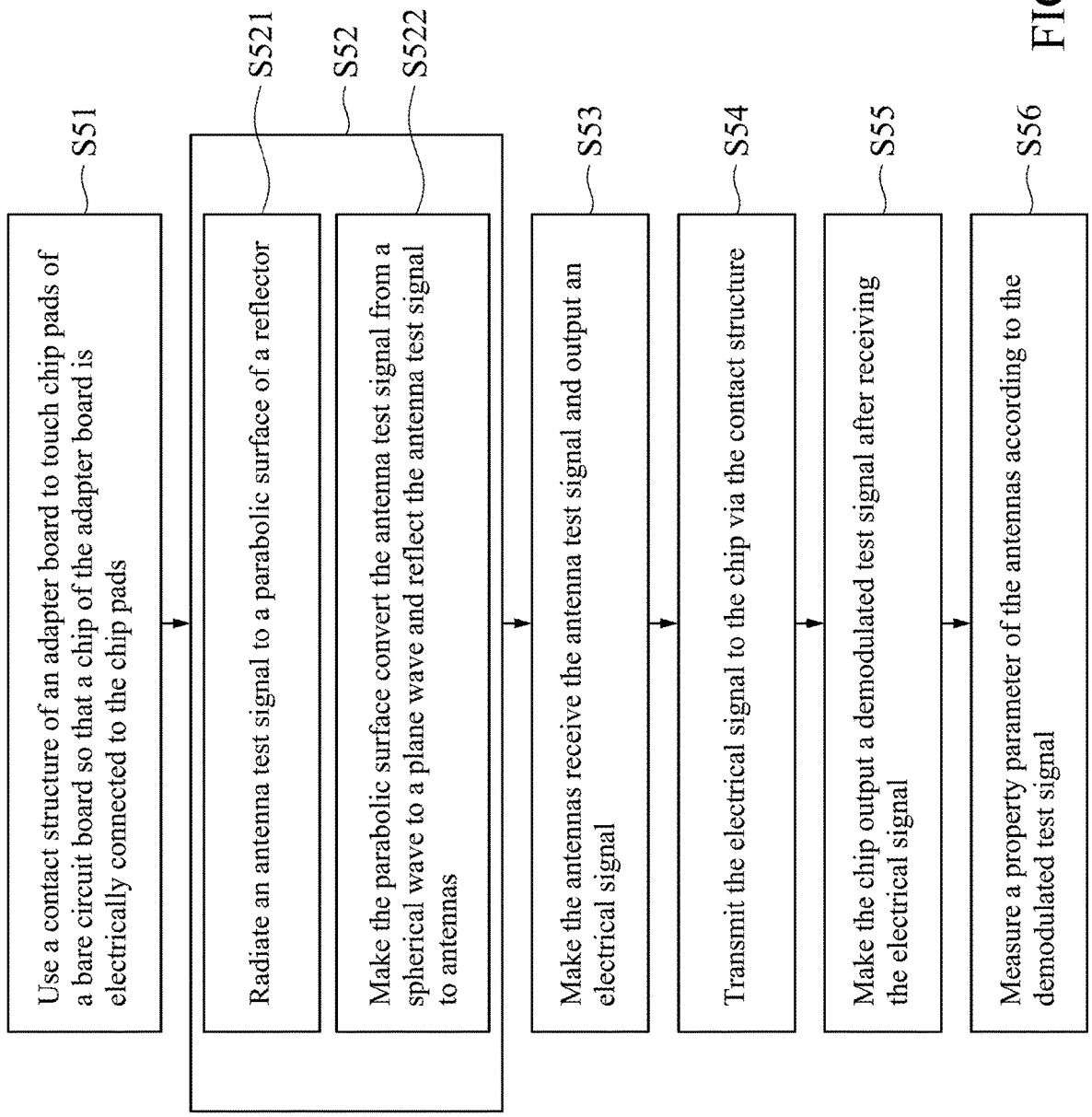
FIG. 9 is a flow chart of an inspection method according to another embodiment of this disclosure.

FIG. 9 is a flow chart of an inspection method 5 according to another embodiment of this disclosure. The following description of the inspection method 5 is applied to the inspection system 1D of FIG. 8 for example, but those skilled in the art also apply the inspection method 5 to other similar inspection systems to inspect the properties of the antennas 130 of the bare circuit board 100. Step S51 of the inspection method 5 in FIG. 9 is similar to step S31 of the inspection method 3 in FIG. 5, and the similar and the same features of the inspection method 3 and the inspection method 5 substantially don't repeat again. Referring to FIGS. 8 and 9, in step S52, make the control device 15 control the vector signal generator 143 to generate an antenna test signal SD1. The frequency converter 142 changes the frequency of the antenna test signal SD1 and transmits the antenna test signal SD1 to the transceiver antenna 131. The transceiver antenna 131 radiates an antenna test signal SD2.

Further, step S52 includes sub-steps S521 and S522. In sub-step S521, make the transceiver antenna 131 receive the antenna test signal SD1 and radiate the antenna test signal SD2 to the parabolic surface of the reflector 132, in which the antenna test signal SD2 radiated from the transceiver antenna 131 is a wireless signal. Then, in sub-step S522, make the parabolic surface convert the antenna test signal SD2 from the spherical wave to the plane wave and reflect the antenna test signal SD2 to the antennas 130.

Then, in step S53, make the antennas 130 receive the antenna test signal SD2 and output an electrical signal SD3. In step S54, the electrical signal SD3 is transmitted to the chip 122 via the contact structure 123. In step S55, make the chip 122 receive the electrical signal SD3 and output a demodulated test signal SD4 after demodulating. In step S56, the measuring device 14 measures the at least one property parameter of the antennas 130 according to the demodulated test signal SD4, in which the vector signal analyzer 141 of the measuring device 14 may measure the at least one property parameter such as at least one of the error vector magnitude (EVM), the total isotropic sensitivity (TIS) and the radiated power. The control device 15 obtains the capability of the antennas 130 according to the measured at least one property parameter, thereby picking the qualified bare circuit boards 100.

Based on the above, by the arrangement of the reflector 132 is made more flexibly to use the anechoic chamber 16, thereby using the space more efficiently.

Figure 10:
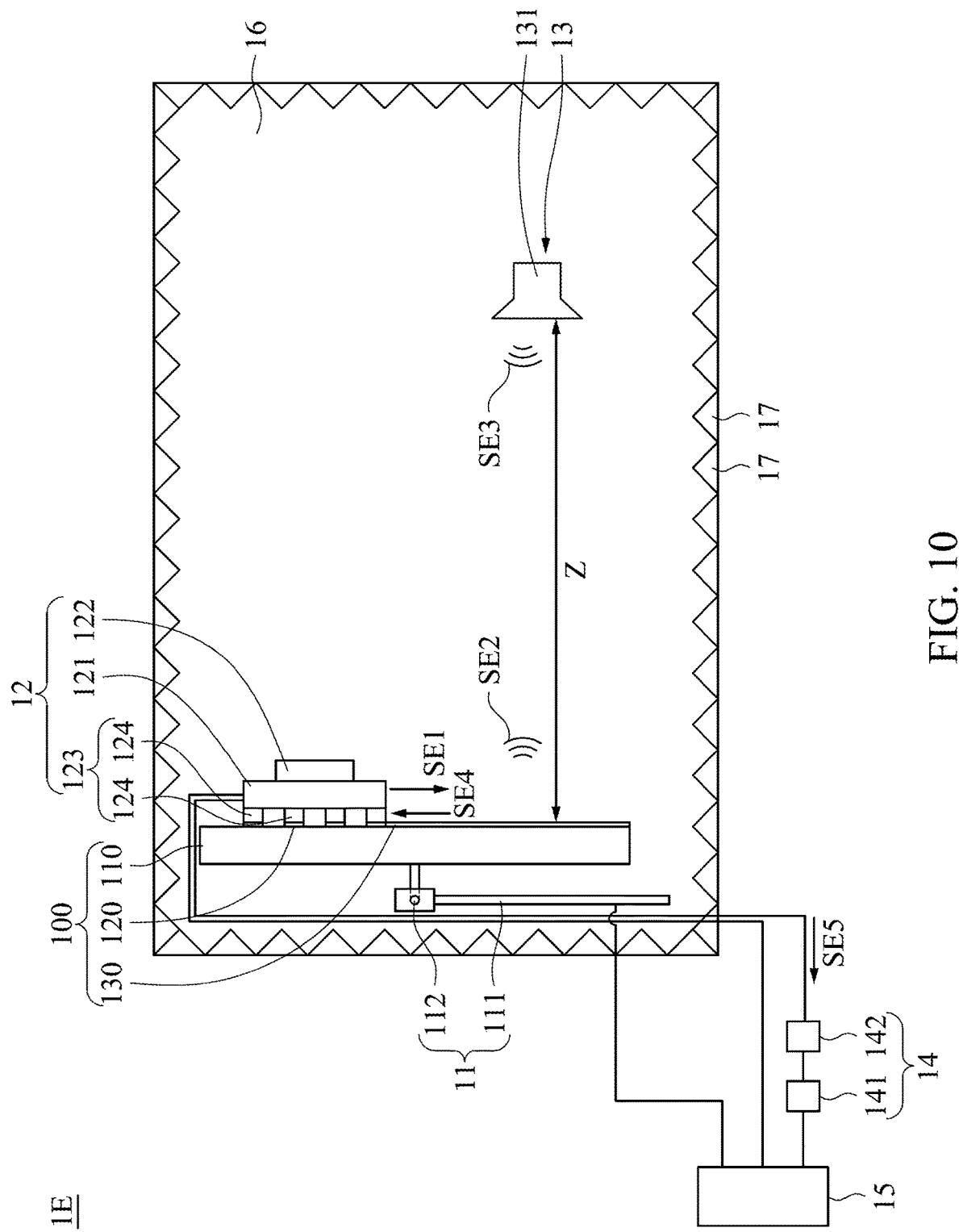
FIG. 10 is a schematic diagram of an inspection system according to another embodiment of this disclosure.

FIG. 10 is a schematic diagram of an inspection system 1E according to another embodiment of this disclosure. The inspection system 1E in FIG. 10 is similar to the inspection system 1A in FIG. 1, in which the components with the similar and the same features in the inspection system 1A and the inspection system 1E are denoted by the same reference characters. The contrast between the inspection system 1A and the inspection system 1E is that the vector signal analyzer 141 of the inspection system 1E in FIG. 10 is not electrically connected to the transceiver antenna 131 but is electrically connected to the chip 122 of the adapter board 12. The frequency converter 142 is electrically connected between the vector signal analyzer 141 and the chip 122.

Figure 11:
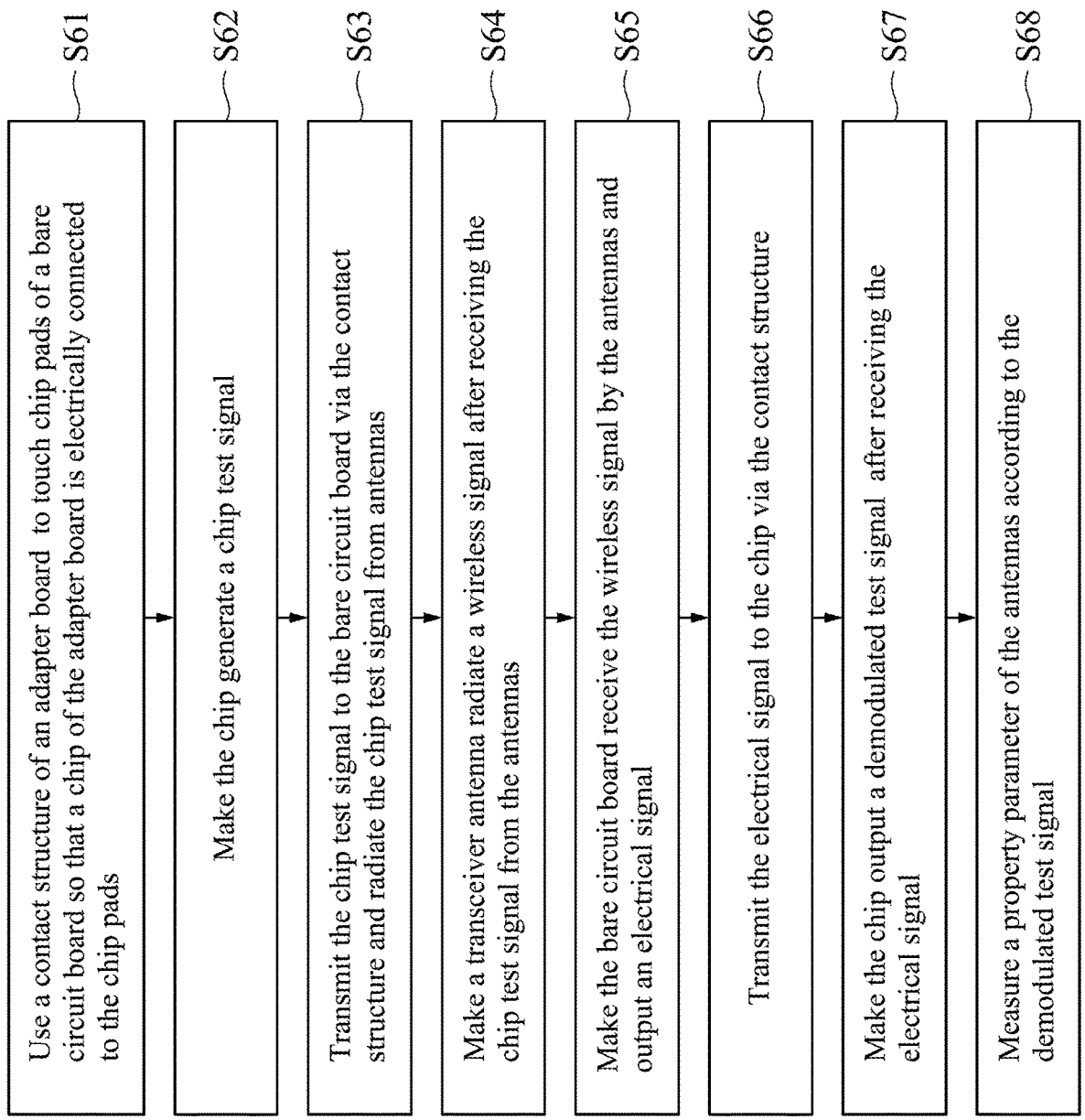
FIG. 11 is a flow chart of an inspection method according to another embodiment of this disclosure.

FIG. 11 is a flow chart of an inspection method 6 according to another embodiment of this disclosure. The following description of the inspection method 6 is applied to the inspection system 1E of FIG. 10 for example, but those skilled in the art also apply the inspection method 6 to other similar inspection systems to inspect the properties of the antennas 130 of the bare circuit board 100. Step S61 of the inspection method 6 in FIG. 11 is similar to step S21 of the inspection method 2 in FIG. 3, and the similar and the same features of the inspection method 2 and the inspection method 6 substantially don't repeat again.

Referring to FIGS. 10 and 11, in step S62, make the chip 122 generate a chip test signal SE1. In step S63, the chip test signal SE1 is transmitted to the chip pads 120 of the bare circuit board 100 via the contact structure 123 and then, transmitted to the antennas 130. The antennas 130 radiate a chip test signal SE2, in which the chip test signal SE2 radiated from the antennas 130 is a wireless signal.

Then, in step S64, the transceiver antenna 131 radiates a wireless signal SE3 after receiving the chip test signal SE2 from the antennas 130. In step S65, make the bare circuit board 100 receive the wireless signal SE3 by the antennas 130 and output an electrical signal SE4. In step S66, the electrical signal SE4 is transmitted to the chip 122 via the contact structure 123. In step S67, make the chip 122 receive the electrical signal SE4 and output a demodulated test signal SE5 after demodulating.

In step S68, the measuring device 14 measures the at least one property parameter of the antennas 130 according to the demodulated test signal SE5, in which the vector signal analyzer 141 of the measuring device 14 may measure the at least one property parameter such as at least one of the error vector magnitude (EVM), the total isotropic sensitivity (TIS) and the radiated power. The control device 15 obtains the capability of the antennas 130 according to the measured at least one property parameter, thereby picking the qualified bare circuit boards 100. From the inspection method 6, the capability of the antennas 130 is inspected by measuring the electromagnetic wave through a complete route.

Consequently, the inspection systems and the inspection methods disclosed from above embodiments can make the antennas 130 of the bare circuit board 100 electrically connected to the chip 122 by using the adapter board 12 to touch the bare circuit board 100 directly, and the antennas 130 are controlled by the chip 122 to act, thereby inspecting the bare circuit board 100. In addition, the inspection systems and the inspection methods of this disclosure can use various kinds of adapter boards 12 having different chips to inspect the antennas 130 according to different inspecting requirements.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An inspection system used for inspecting a bare circuit board, wherein the bare circuit board comprises a chip pad and an antenna, the chip pad is electrically connected to the antenna, and the inspection system comprises:
    an adapter board comprising a chip and a contact structure, wherein the chip is electrically connected to the contact structure, and the contact structure touches the chip pad so that the chip is electrically connected to the chip pad;
    a test device comprising a transceiver antenna, wherein the test device and the bare circuit board separate; and
    a measuring device electrically connected to one of the chip and the transceiver antenna,
    wherein when the chip generates a chip test signal, the chip test signal is transmitted to the bare circuit board via the contact structure and radiated from the antenna, wherein the transceiver antenna outputs an electrical test signal to the measuring device after receiving the chip test signal, wherein the measuring device measures a property parameter of the antenna according to the electrical test signal,
    wherein when the transceiver antenna radiates an antenna test signal, the bare circuit board receives the antenna test signal by the antenna, and the antenna outputs and transmits an electrical signal to the chip via the contact structure, wherein the chip outputs a demodulated test signal to the measuring device after receiving the electrical signal, wherein the measuring device measures the property parameter of the antenna according to the demodulated test signal.

2. The inspection system of claim 1, wherein the transceiver antenna directs to the antenna and is spaced from the antenna by a direct test distance,
  wherein when frequencies of the chip test signal and the antenna test signal are less than 3 GHZ, the direct test distance is greater than 10 meters or equal to 10 meters,
  wherein when the frequencies of the chip test signal and the antenna test signal are in a range of 3 GHz to 30 GHz, the direct test distance is in a range of 5 meters to 10 meters,
  wherein when the frequencies of the chip test signal and the antenna test signal are in a range of 30 GHz to 110 GHz, the direct test distance is in a range of 3 meters to 5 meters,
  wherein when the frequencies of the chip test signal and the antenna test signal are greater than 110 GHz, the direct test distance is less than 3 meters.

3. The inspection system of claim 1, wherein the test device further comprises a reflector that has a parabolic surface, wherein the antenna directs to the parabolic surface and is spaced from the parabolic surface by a first distance, wherein the transceiver antenna directs to the parabolic surface and is spaced from the parabolic surface by a second distance, and the reflector is configured to convert the chip test signal radiated from the antenna from a spherical wave to a plane wave and reflect the chip test signal to the transceiver antenna.

4. The inspection system of claim 3, wherein a sum of the first distance and the second distance is substantially equal to a direct test distance,
  wherein when a frequency of the chip test signal is less than 3 GHZ, the direct test distance is greater than 10 meters or equal to 10 meters,
  wherein when the frequency of the chip test signal is in a range of 3 GHz to 30 GHz, the direct test distance is in a range of 5 meters to 10 meters,
  wherein when the frequency of the chip test signal is in a range of 30 GHz to 110 GHz, the direct test distance is in a range of 3 meters to 5 meters,
  wherein when the frequency of the chip test signal is greater than 110 GHZ, the direct test distance is less than 3 meters.

5. The inspection system of claim 1, wherein the test device further comprises a reflector that has a parabolic surface, wherein the transceiver antenna directs to the parabolic surface and is spaced from the parabolic surface by a first distance, wherein the antenna directs to the parabolic surface and is spaced from the parabolic surface by a second distance, and the reflector is configured to convert the antenna test signal radiated from the transceiver antenna from a spherical wave to a plane wave and reflect the antenna test signal to the antenna.

6. The inspection system of claim 5, wherein a sum of the first distance and the second distance is substantially equal to a direct test distance,
  wherein when a frequency of the antenna test signal is less than 3 GHZ, the direct test distance is greater than 10 meters or equal to 10 meters,
  wherein when the frequency of the antenna test signal is in a range of 3 GHz to 30 GHz, the direct test distance is in a range of 5 meters to 10 meters,
  wherein when the frequency of the antenna test signal is in a range of 30 GHz to 110 GHz, the direct test distance is in a range of 3 meters to 5 meters,
  wherein when the frequency of the antenna test signal is greater than 110 GHz, the direct test distance is less than 3 meters.

7. The inspection system of claim 1, wherein the contact structure comprises a copper pillar.

8. An inspection method comprising:
  using a contact structure of an adapter board to touch a chip pad of a bare circuit board so that a chip of the adapter board is electrically connected to an antenna of the bare circuit board via the chip pad;
  making the chip generate a chip test signal;
  transmitting the chip test signal to the bare circuit board via the contact structure and radiating the chip test signal from the antenna of the bare circuit board;
  outputting an electrical test signal from a transceiver antenna after receiving the chip test signal from the antenna; and
  measuring a property parameter of the antenna according to the electrical test signal.

9. The inspection method of claim 8, after radiating the chip test signal from the antenna of the bare circuit board, further comprising:
  radiating a wireless signal after the transceiver antenna receives the chip test signal from the antenna;
  making the bare circuit board receive the wireless signal and output an electrical signal by the antenna;
  making the electrical signal outputted from the antenna transmit to the chip via the contact structure;
  making the chip output a demodulated test signal after the chip receives the electrical signal; and
  measuring the property parameter of the antenna according to the demodulated test signal.

10. The inspection method of claim 8, wherein the transceiver antenna directs to the antenna and is spaced from the antenna by a direct test distance,
  wherein when a frequency of the chip test signal is less than 3 GHZ, the direct test distance is greater than 10 meters or equal to 10 meters,
  wherein when the frequency of the chip test signal is in a range of 3 GHz to 30 GHz, the direct test distance is in a range of 5 meters to 10 meters,
  wherein when the frequency of the chip test signal is in a range of 30 GHz to 110 GHz, the direct test distance is in a range of 3 meters to 5 meters,
  wherein when the frequency of the chip test signal is greater than 110 GHZ, the direct test distance is less than 3 meters.

11. The inspection method of claim 8, wherein the antenna directs to a parabolic surface of a reflector and is spaced from the parabolic surface by a first distance, wherein the transceiver antenna directs to the parabolic surface and is spaced from the parabolic surface by a second distance, and radiating the chip test signal from the antenna comprises:
  making the chip test signal radiate to the parabolic surface of the reflector; and
  making the parabolic surface convert the chip test signal from a spherical wave to a plane wave and reflect the chip test signal to the transceiver antenna.

12. The inspection method of claim 11, wherein a sum of the first distance and the second distance is substantially equal to a direct test distance,
  wherein when a frequency of the chip test signal is less than 3 GHZ, the direct test distance is greater than 10 meters or equal to 10 meters,
  wherein when the frequency of the chip test signal is in a range of 3 GHz to 30 GHz, the direct test distance is in a range of 5 meters to 10 meters,
  wherein when the frequency of the chip test signal is in a range of 30 GHz to 110 GHz, the direct test distance is in a range of 3 meters to 5 meters, wherein when the frequency of the chip test signal is greater than 110 GHZ, the direct test distance is less than 3 meters.

13. An inspection method comprising:
using a contact structure of an adapter board to touch a chip pad of a bare circuit board so that a chip of the adapter board is electrically connected to an antenna of the bare circuit board via the chip pad;
making a transceiver antenna radiate an antenna test signal;
making the antenna of the bare circuit board receive the antenna test signal and output an electrical signal;
transmitting the electrical signal to the chip via the contact structure;
making the chip output a demodulated signal after the chip receives the electrical signal; and
measuring a property parameter of the antenna according to the demodulated signal.

14. The inspection method of claim 13, wherein the transceiver antenna directs to the antenna and is spaced from the antenna by a direct test distance,
wherein when a frequency of the antenna test signal is less than 3 GHZ, the direct test distance is greater than 10 meters or equal to 10 meters,
wherein when the frequency of the antenna test signal is in a range of 3 GHz to 30 GHz, the direct test distance is in a range of 5 meters to 10 meters,
wherein when the frequency of the antenna test signal is in a range of 30 GHz to 110 GHz, the direct test distance is in a range of 3 meters to 5 meters,
wherein when the frequency of the antenna test signal is greater than 110 GHz, the direct test distance is less than 3 meters.

15. The inspection method of claim 13, wherein the transceiver antenna directs to a parabolic surface of a reflector and is spaced from the parabolic surface by a first distance, wherein the antenna directs to the parabolic surface and is spaced from the parabolic surface by a second distance, and radiating the antenna test signal from the transceiver antenna comprises:
making the antenna test signal radiate to the parabolic surface of the reflector; and
making the parabolic surface convert the antenna test signal from a spherical wave to a plane wave and reflect the antenna test signal to the transceiver antenna.

16. The inspection method of claim 15, wherein a sum of the first distance and the second distance is substantially equal to a direct test distance,
wherein when a frequency of the antenna test signal is less than 3 GHZ, the direct test distance is greater than 10 meters or equal to 10 meters,
wherein when the frequency of the antenna test signal is in a range of 3 GHz to 30 GHz, the direct test distance is in a range of 5 meters to 10 meters,
wherein when the frequency of the antenna test signal is in a range of 30 GHz to 110 GHz, the direct test distance is in a range of 3 meters to 5 meters,
wherein when the frequency of the antenna test signal is greater than 110 GHz, the direct test distance is less than 3 meters.

* * * * *